(12) United States Patent
Zang et al.

(10) Patent No.: US 10,871,861 B2
(45) Date of Patent: Dec. 22, 2020

(54) ARRAY SUBSTRATE, METHOD OF FABRICATING ARRAY SUBSTRATE, TOUCH DISPLAY PANEL, AND TOUCH DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Pengcheng Zang, Beijing (CN); Weiyun Huang, Beijing (CN); Ting Li, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 138 days.

(21) Appl. No.: 15/578,943

(22) PCT Filed: May 22, 2017

(86) PCT No.: PCT/CN2017/085305
§ 371 (c)(1),
(2) Date: Dec. 1, 2017

(87) PCT Pub. No.: WO2018/072440
PCT Pub. Date: Apr. 26, 2018

(65) Prior Publication Data
US 2018/0299984 A1 Oct. 18, 2018

(30) Foreign Application Priority Data
Oct. 21, 2016 (CN) .......................... 2016 1 0922107

(51) Int. Cl.
*G06F 3/044* (2006.01)
*G06F 3/041* (2006.01)
(Continued)

(52) U.S. Cl.
CPC .......... *G06F 3/044* (2013.01); *G02F 1/13338* (2013.01); *G02F 1/13439* (2013.01);
(Continued)

(58) Field of Classification Search
CPC combination set(s) only.
See application file for complete search history.

(56) References Cited

U.S. PATENT DOCUMENTS

2012/0081329 A1* 4/2012 Kim .................. G06F 3/045
345/174
2013/0299330 A1* 11/2013 Tao .................. G06F 3/044
200/600
(Continued)
2014/0138717 A1* 5/2014 Kong ................ G02F 1/133555
257/88
2015/0370114 A1 12/2015 Du et al.

FOREIGN PATENT DOCUMENTS

CN 101593069 A 12/2009
CN 104216564 A 12/2014
(Continued)

OTHER PUBLICATIONS

Office Action dated Jan. 14, 2019, issued in counterpart CN Application No. 201610922107.0, with English translation (31 pages).
(Continued)

*Primary Examiner* — Lauren Nguyen
(74) *Attorney, Agent, or Firm* — Westerman, Hattori, Daniels & Adrian, LLP

(57) ABSTRACT

An array substrate, a method of fabricating array substrate, a display panel including the array substrate, and a display device including the display panel, wherein the array substrate includes a first electrode layer and a second electrode layer arranged in an electrode stack, a data line (60) in a
(Continued)

space between adjacent second transparent electrode layers, and at least one touch electrode lead (20) that is in contact with the first electrode layer.

19 Claims, 11 Drawing Sheets

(51) Int. Cl.
  *G02F 1/1333*  (2006.01)
  *G02F 1/1343*  (2006.01)
  *G02F 1/1362*  (2006.01)
  *H01L 27/12*  (2006.01)

(52) U.S. Cl.
  CPC ...... *G02F 1/133345* (2013.01); *G06F 3/0412* (2013.01); *G02F 1/134309* (2013.01); *G02F 1/136286* (2013.01); *G02F 2201/122* (2013.01); *G06F 2203/04103* (2013.01); *H01L 27/1248* (2013.01)

(56) References Cited

U.S. PATENT DOCUMENTS

| | | | |
|---|---|---|---|
| 2016/0291424 A1 | 10/2016 | Sun et al. | |
| 2016/0291790 A1* | 10/2016 | Yao | G06F 3/0418 |
| 2016/0327834 A1* | 11/2016 | Yu | G02F 1/134363 |

FOREIGN PATENT DOCUMENTS

| | | |
|---|---|---|
| CN | 204203592 U | 3/2015 |
| CN | 104698700 A | 6/2015 |
| CN | 104699321 A | 6/2015 |
| CN | 105093607 A | 11/2015 |
| CN | 106324924 A | 1/2017 |
| JP | 5174745 B2 | 4/2013 |

OTHER PUBLICATIONS

English translation of International Search Report dated May 22, 2017, issued in counterpart International Application No. PCT/CN2017/085305 (14 pages).

\* cited by examiner

ARRAY SUBSTRATE, METHOD OF FABRICATING ARRAY SUBSTRATE, TOUCH DISPLAY PANEL, AND TOUCH DISPLAY DEVICE

CROSS-REFERENCE TO RELATED APPLICATIONS

This application claims the benefit of the filing date of Chinese Patent Application No. 201610922107.0 filed on Oct. 21, 2016, the entire disclosure of which is hereby incorporated by reference.

TECHNICAL FIELD

The present disclosure generally relates to touch display technologies, and in particular, to an array substrate, a method of fabricating the array substrate, a display panel including the array substrate, and a display device including the display panel.

BACKGROUND

With the rapid development of display technologies, the convenience of touch panels (TP) has transformed them into an integral part of people's work and lives. In particular, in-cell capacitive-type touch panels are among the most widely used display technologies in existence today.

In conventional techniques, in order to shield electrodes (for example, pixel electrodes) from interference, widths of touch electrode leads are widened. However, increasing the width of a touch electrode lead can prevent the proper re-alignment of liquid crystal molecules located on the periphery of a pixel electrode, which in turn may prevent light from passing through the periphery of the pixel electrode and limit the overall transmittance of the touch panel.

BRIEF SUMMARY

One embodiment of the present disclosure is an array substrate. The array substrate may comprise a base substrate comprising a display region and a non-display region; and an electrode stack on the display region of the base substrate. The electrode stack may comprise a first electrode layer; a second electrode layer on a different plane of the electrode stack from the first electrode layer; a plurality of touch electrode leads; and at least one first transparent auxiliary electrode line. The first electrode layer may comprise a plurality of first transparent electrodes configured to function as a common electrode and a touch electrode on a time-sharing basis. Each of the first transparent electrodes may comprise a plurality of sub-electrodes. The second electrode layer may comprise a plurality of second transparent electrodes. At least one of the plurality of touch electrode leads may be in contact with a sub-electrode. At least one of the plurality of touch electrode leads may not be in contact with a sub-electrode and may be between two sub-electrodes. At least one first transparent auxiliary electrode line may connect the two sub-electrodes having the touch electrode lead therebetween.

In at least some embodiments, at least one first transparent auxiliary electrode line is on a side of the touch electrode leads opposite from the base substrate.

In at least some embodiments, an array substrate according to the present disclosure may further comprise at least one data line between adjacent second transparent electrodes. At least one data line may extend in a first extension direction. Touch electrode leads may extend in a second extension direction that is parallel to the first extension direction. At least one first transparent auxiliary electrode line may be on a side of the at least one data line opposite from the base substrate.

In at least some embodiments, a width of the at least one first transparent auxiliary electrode line is larger than a width of the at least one data line.

In at least some embodiments, at least one first transparent auxiliary electrode line forms a T-shape.

In at least some embodiments, an array substrate according to the present disclosure may further comprise at least one second transparent auxiliary electrode line in a same plane of the electrode stack as the at least one first transparent auxiliary electrode line. At least one second transparent auxiliary electrode line may be on the at least one touch electrode lead that is in contact with the sub-electrode.

In at least some embodiments, at least one first transparent auxiliary electrode line is in a same plane of the electrode stack as the second electrode layer. At least one first transparent auxiliary electrode line may be insulated from the second electrode layer.

In at least some embodiments, the first electrode layer is between the second electrode layer and the base substrate.

In at least some embodiments, an array substrate according to the present disclosure may further comprise a first passivation layer between the first electrode layer and the base substrate. The first electrode layer and the touch electrode lines may be above the first passivation layer.

In at least some embodiments, an array substrate according to the present disclosure may further comprise a second passivation layer above the first electrode layer and the touch electrode lines. The second passivation layer may comprise at least one pair of through-holes. At least one first transparent auxiliary electrode line may connect the two sub-electrodes having the touch electrode lead therebetween through at least one pair of through-holes.

In at least some embodiments, at least two touch electrode leads are in contact with respective ones of the plurality of sub-electrodes.

Another embodiment of the present disclosure is a method for fabricating an array substrate. The method may comprise forming a first pattern on a base substrate, the first pattern comprising a first electrode layer that comprises a plurality of first transparent electrodes; forming a second pattern on the base substrate, the second pattern comprising a plurality of touch electrode leads; after forming the first pattern and the second pattern, forming a third pattern comprising (i) a second electrode layer that comprises a plurality of second transparent electrodes, and (ii) at least one first transparent auxiliary electrode line. In the second pattern, each of the touch electrode leads may extend in one of a plurality of non-overlapping extension paths. In forming the second pattern, at least one of the touch electrode leads may be in contact with the first electrode layer, and at least one of the touch electrode leads not in contact with the first electrode layer may divide each of the first transparent electrodes positioned on the extension path of the at least one touch electrode lead not in contact with the first electrode layer into adjacent sub-electrodes.

In at least some embodiments, in forming the third pattern, the at least one first transparent auxiliary electrode line may connect the adjacent sub-electrodes having the touch electrode line therebetween. In at least some embodiments, the third pattern further comprises at least one second transparent auxiliary electrode line.

In at least some embodiments, a method for fabricating an array substrate according to the present disclosure may further comprise forming at least one data line between adjacent second transparent electrodes.

In at least some embodiments, a width of the at least one first transparent auxiliary electrode line is larger than a width of the at least one data line.

In at least some embodiments, a method for fabricating an array substrate according to the present disclosure may further comprise forming a first passivation layer between the base substrate and the first electrode layer.

In at least some embodiments, a method for fabricating an array substrate according to the present disclosure may further comprise forming a second passivation layer above the first electrode layer and the touch electrode lines.

Another embodiment of the present disclosure is a touch display panel. The touch display panel may comprise an array substrate as described above; a panel substrate facing the array substrate, the panel substrate being aligned with the array substrate; and a liquid crystal layer between the array substrate and the panel substrate.

Another embodiment of the present disclosure is a display device. The display device may comprise a touch panel as described above; and an integrated circuit chip on the non-display region of the array substrate.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Next, the embodiments of the present disclosure will be described clearly and completely in conjunction with the accompanying drawings, which are described briefly above. The subject matter of the present disclosure is described with specificity to meet statutory requirements. However, the description itself is not intended to limit the scope of this disclosure. Rather, the inventors have contemplated that the claimed subject matter might also be embodied in other ways, to include different steps or elements similar to the ones described in this document, in conjunction with other present or future technologies.

While the present technology has been described in connection with the embodiments of the various figures, it is to be understood that other similar embodiments may be used or modifications and additions may be made to the described embodiment for performing the same function of the present technology without deviating therefrom. Therefore, the present technology should not be limited to any single embodiment, but rather should be construed in breadth and scope in accordance with the appended claims. In addition, all other embodiments obtained by one of ordinary skill in the art based on embodiments described in this document are considered to be within the scope of this disclosure.

Figure 1:
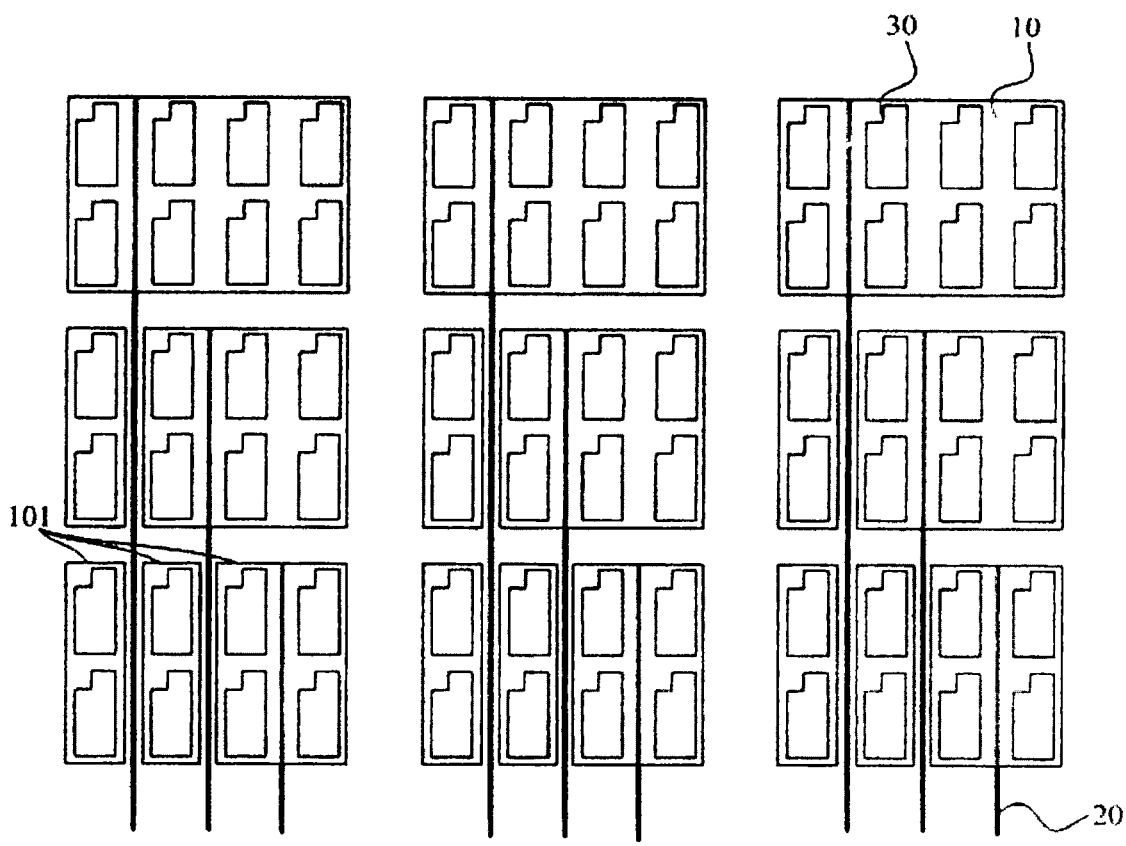
FIG. 1 shows a top view of a related array substrate.

Conventional fabrication techniques for in-cell capacitive-type touch panels (for example, as shown in FIG. 1) usually include patterning a transparent electrode layer for driving liquid crystal alignment into a plurality of individual transparent electrodes (the "first transparent electrodes"). An integrated circuit (IC) chip transmits common electrode signals and touch signals to the first transparent electrodes on a time-sharing basis, via touch electrode leads coupled to the first transparent electrodes. The first transparent electrodes thus double as both a common electrode and a touch electrode.

In an array substrate according to the present disclosure, for example, as shown in FIGS. 2a, 2b, 3a, 3b, 4a, and 5a, a first electrode layer comprising a plurality of first transparent electrodes 10 and a second electrode layer comprising a plurality of second transparent electrodes 30 are disposed on a base substrate. The base substrate comprises a display region 01 and a non-display region 02. The non-display region 02 is located outside of the display region 01.

The first electrode layer and the second electrode layer are arranged in an electrode stack. The first transparent electrodes 10 and the second transparent electrodes 30 are disposed on different planes of the electrode stack. Each first transparent electrode 10 comprises a plurality of sub-electrodes 101 that are spaced apart from each other in at least the transverse direction of the base substrate. Each first transparent electrode 10 is configured to function as a common electrode and a touch electrode on a time-sharing basis. The second transparent electrodes 30 are arranged in an array on a first transparent electrode 10. Optionally, the second transparent electrodes 30 are spaced apart from each other in both a longitudinal direction and a transverse direction of the base substrate.

Figure 2A:
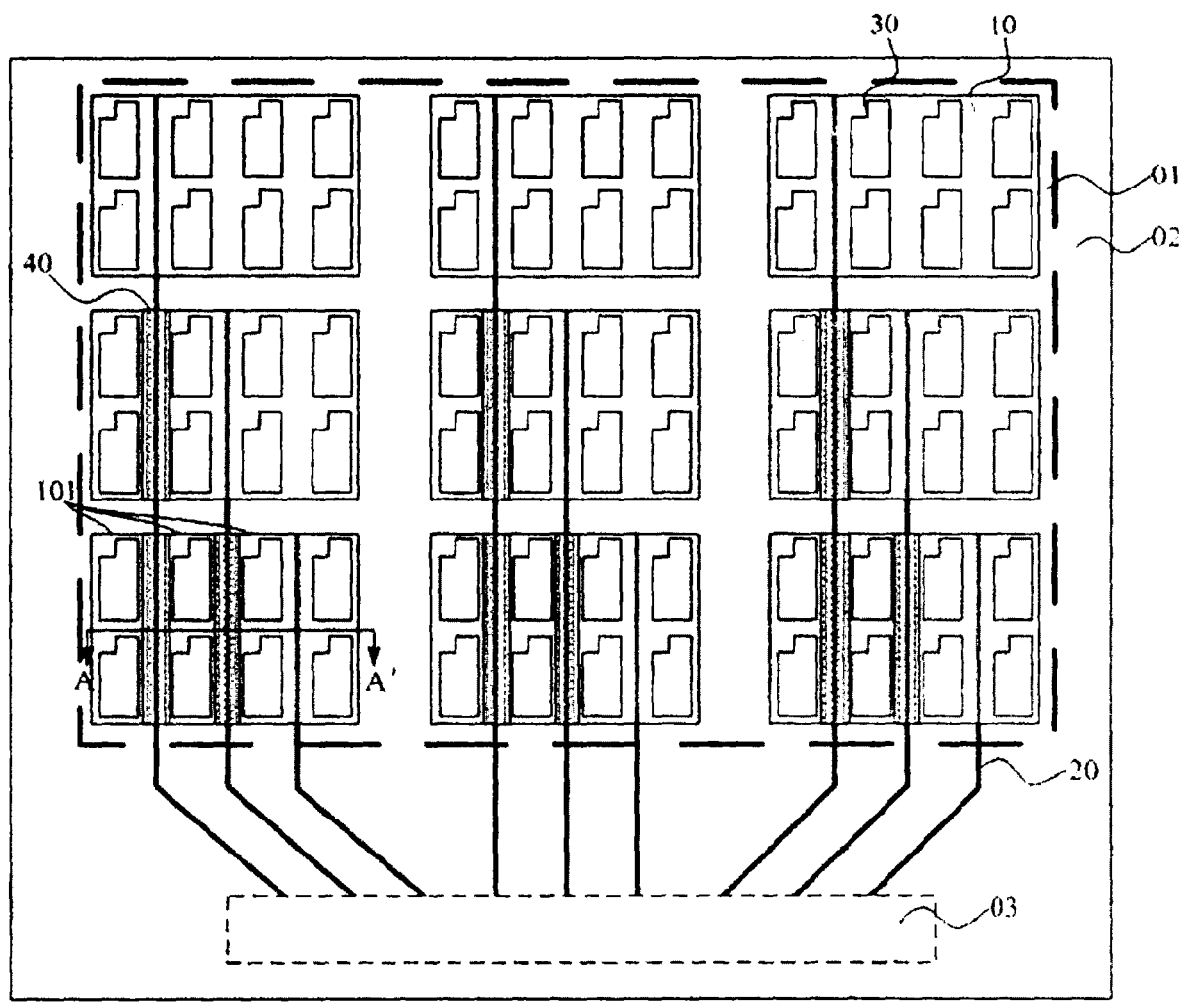
FIG. 2a shows a top view of an array substrate according to an embodiment of the present disclosure.
Figure 2B:
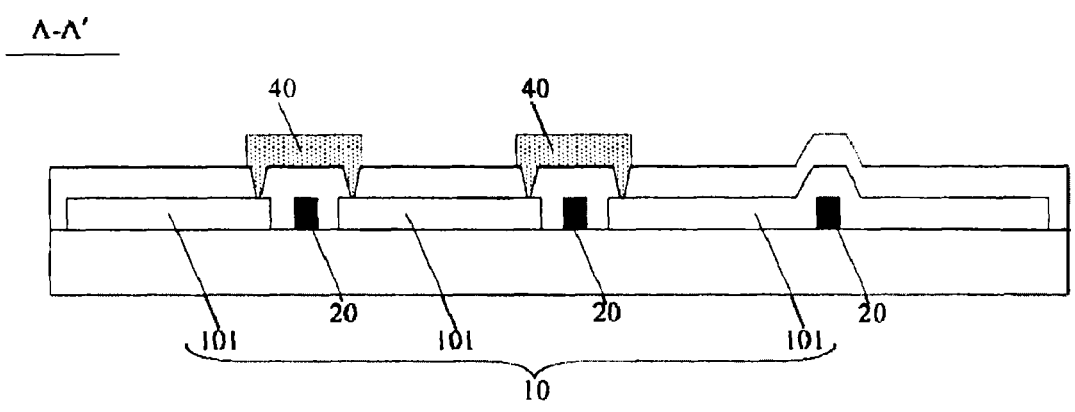
FIG. 2b shows a cross-section of FIG. 2a along the A-A' line.

At least one touch electrode lead 20 is disposed on the electrode stack. In at least some embodiments, the touch electrode lead 20 may be disposed directly on the base substrate. The touch electrode lead 20 may form a protrusion that protrudes upwardly and away from the base substrate. The touch electrode leads 20 extend along non-overlapping extension paths into the non-display region 02 of the base substrate. The touch electrode lead 20 may be composed of a metallic material. At least one touch electrode lead 20 is in contact with a first transparent electrode 10. More particularly, at least one touch electrode 20 is in contact with a sub-electrode 101 of a first transparent electrode 10. The contact may be an electrical contact. In at least some embodiments where a plurality of touch electrode leads 20 are disposed on the electrode stack, a touch electrode lead 20 not in contact with a sub-electrode 101 is disposed between two sub-electrodes 101 that are adjacent to each other in the transverse direction of the base substrate, for example, as shown in FIGS. 2a and 2b. More particularly, during fabrication, the first electrode layer is patterned in a manner where a portion of the touch electrode leads 20 divide each first transparent electrode 10 positioned on the extension paths of the touch electrode leads 20 into adjacent sub-electrodes 101 that are separated by a width of the extension path between the sub-electrodes. Such an arrangement can minimize the risk of the touch electrode leads 20 coming into unwanted electrical contact with other sub-electrodes 101 during fabrication, for example, when running the touch electrode leads 20 through the non-display region 02 of the base substrate.

Optionally, at least two touch electrode leads 20 are in contact with the first transparent electrode 10. This can reduce the resistance of the touch electrode leads 20.

There are no particular limitations on the arrangement of the first transparent electrodes 10 and the touch electrode leads 20 relative to each other. For example, in some embodiments, the touch electrode leads 20 may be formed first on the base substrate, followed by the first transparent electrodes 10, in which case the sub-electrode 101 in contact with a touch electrode lead 20 is disposed on the touch electrode lead 20. In other embodiments, the first transparent electrodes 10 may be formed first on the base substrate, followed by the touch electrode leads 20, in which case the sub-electrode 101 in contact with a touch electrode lead 20 is disposed underneath the touch electrode lead 20.

The position of the portion of the touch electrode lead 20 that is electrically connected to the first transparent electrode 10 determines the direction in which the touch electrode lead 20 will be extended. On this basis, the direction in which the first transparent electrodes 10 will be arranged (i.e., along the extension direction of the touch electrode lead 20) can also be determined.

Figure 4A:
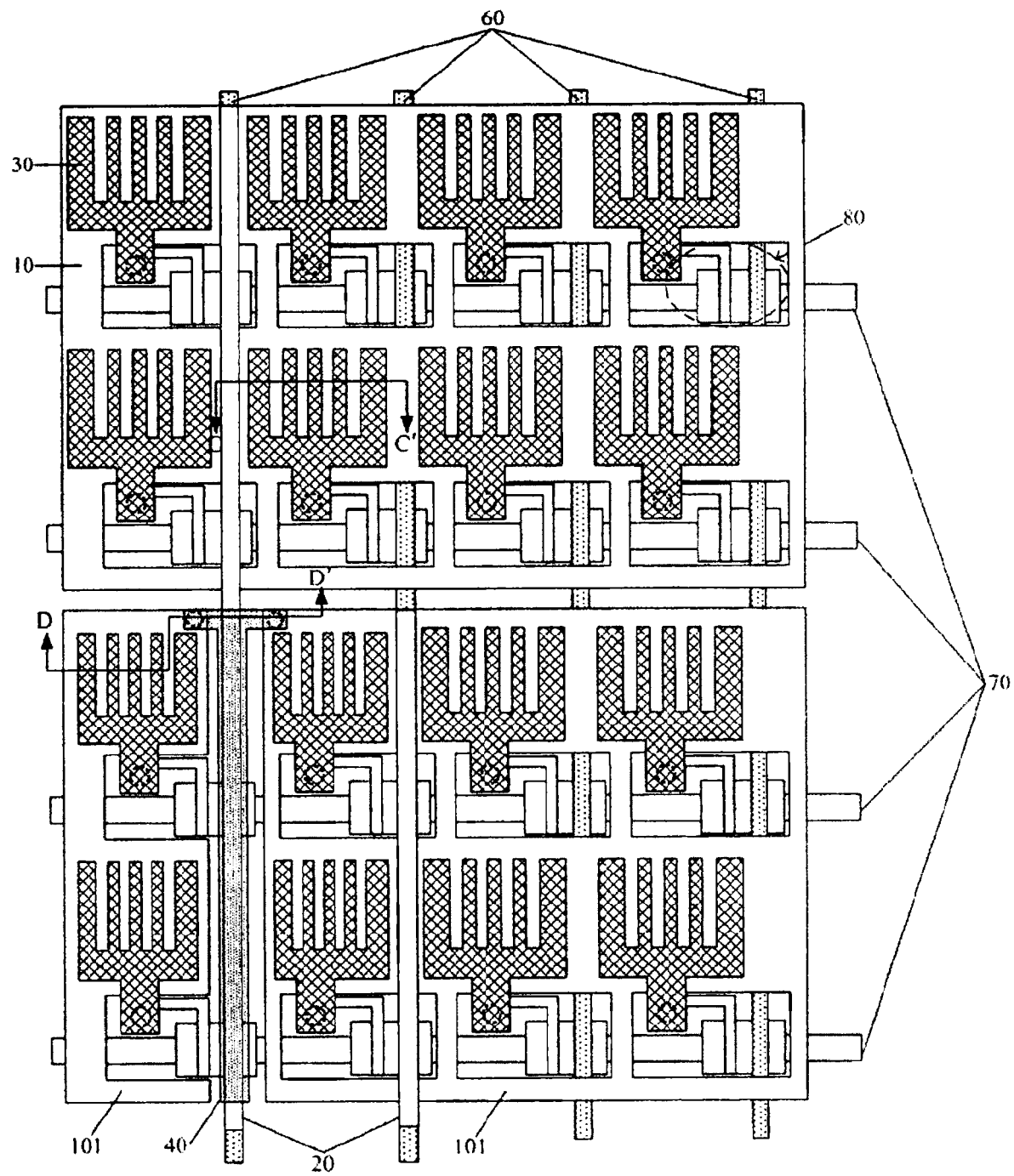
FIG. 4a shows a top view of an array substrate according to another embodiment of the present disclosure.
Figure 5A:
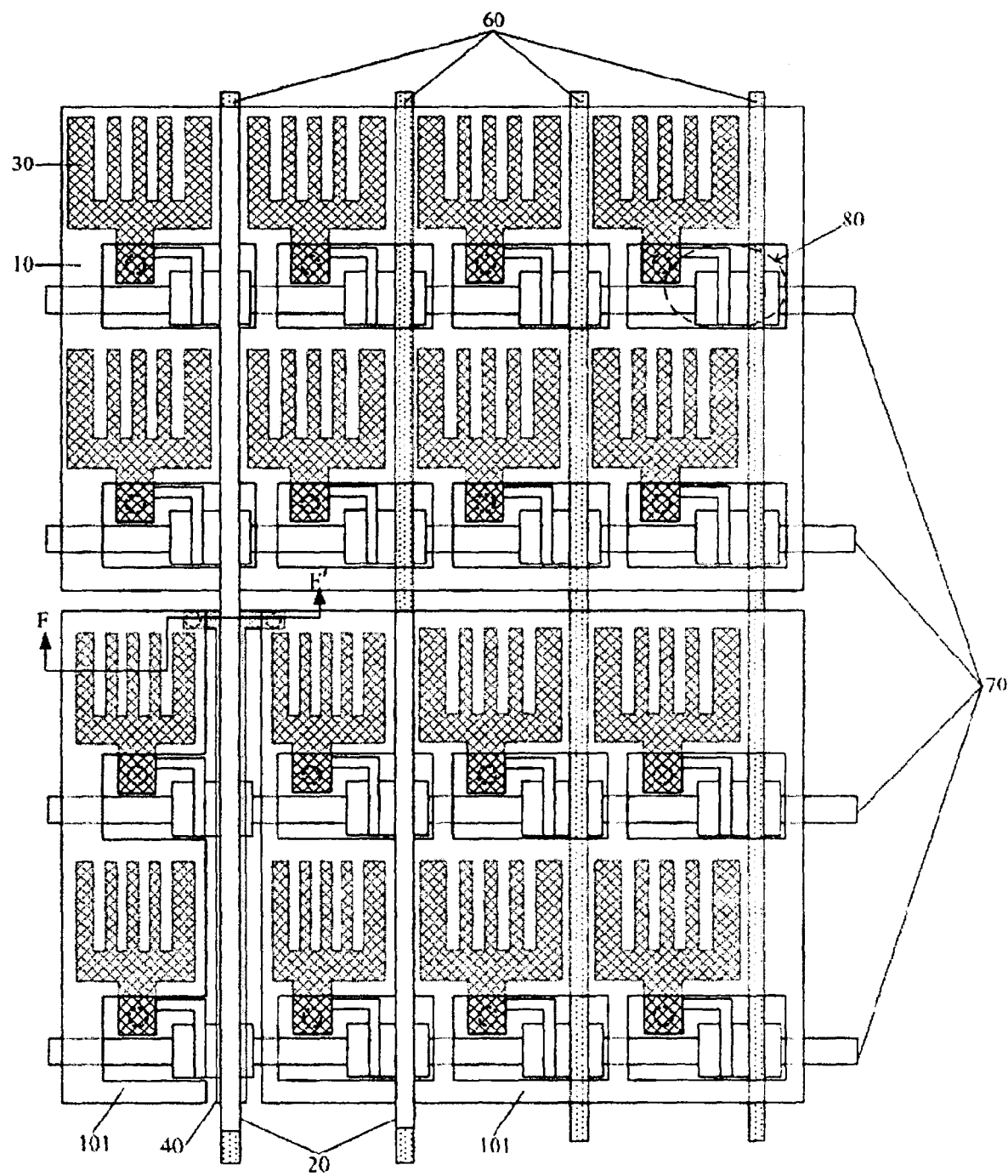
FIG. 5a shows a top view of an array substrate according to another embodiment of the present disclosure.
Figure 6A:
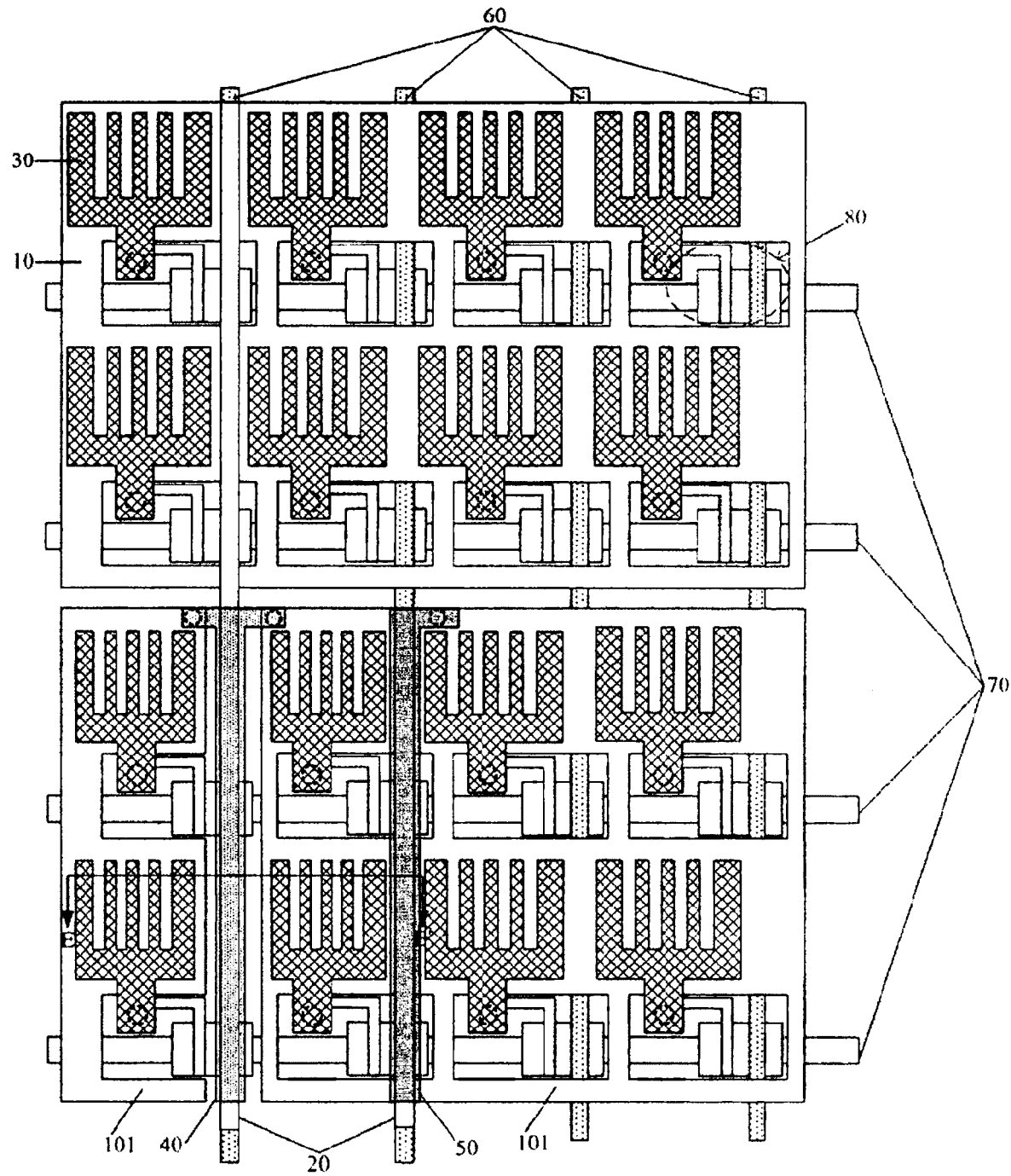
FIG. 6a shows a top view of an array substrate according to another embodiment of the present disclosure.

At least one data line 60 is disposed on the base substrate. In at least some embodiments, the data line 60 is disposed directly on the base substrate. The data line 60 may form a protrusion that protrudes upwardly and away from the base substrate. As shown in FIGS. 4a, 5a, and 6a, the data line 60 may be disposed between two second transparent electrodes 30 that are adjacent to each other in the transverse direction of the base substrate.

Figure 4B:
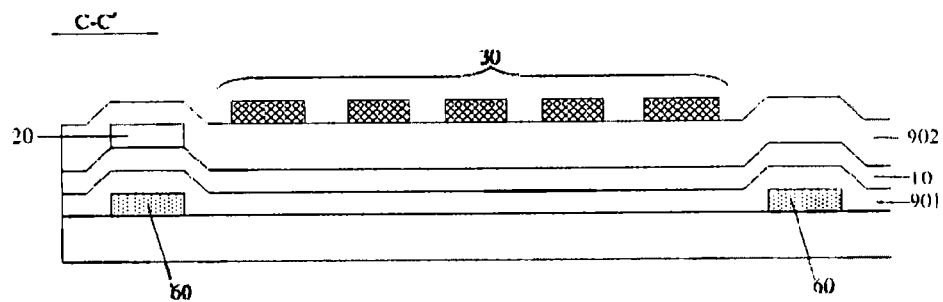
FIG. 4b shows a cross-section of FIG. 4a along the C-C' line.
Figure 5B:
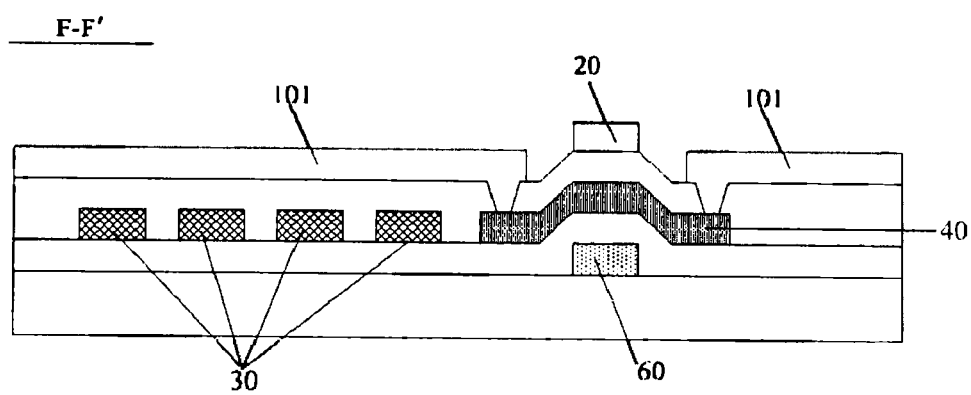
FIG. 5b shows a cross-section of FIG. 5a along the F-F' line.
Figure 6B:
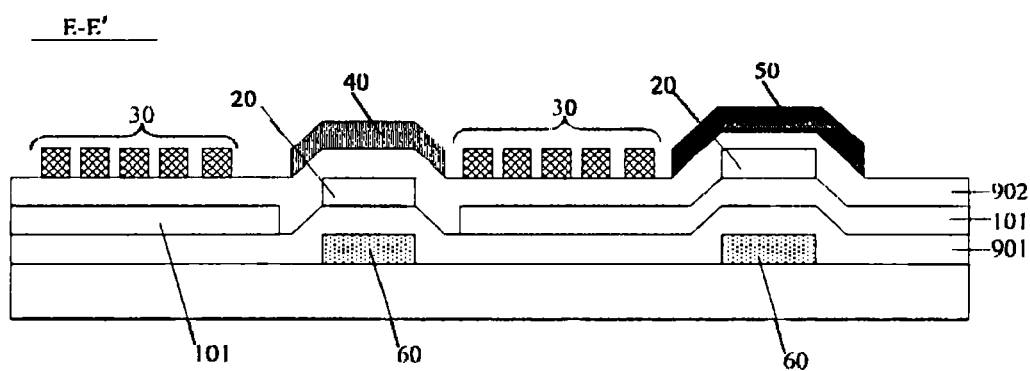
FIG. 6b shows a cross-section of FIG. 6a along the E-E' line.

The touch electrode lead 20 extends in a direction parallel to the extension direction of the data line 60. The touch electrode lead 20 may be positioned to face the data line 60 (for example, as shown in FIGS. 4b, 5b, and 6b). Optionally, the surface of the touch electrode lead 20 facing the data line 60 has a surface area that is larger than the surface area of the surface of the data line 60 facing the touch electrode lead 20. Optionally, the surface of the touch electrode lead 20 can cover an entirety of the opposing surface of the data line 60. In at least some embodiments, a data line 60 and a touch electrode lead 60 are both disposed between two adjacent sub-electrodes 101. For example, as shown in FIGS. 4c, 5b, and 6b, a data line 60 and a touch electrode lead 20 not in contact with a sub-electrode 101 are both disposed between two adjacent sub-electrodes 101.

Optionally, the width of the touch electrode lead 20 may be smaller than the width of the data line 60. Optionally, the width of the first transparent auxiliary electrode line 50 is about 60% to about 100% of the width of the data line 60. Also optionally, an insulation layer may insulate the touch electrode lead 20 from the data line 60.

A plurality of first transparent auxiliary electrode lines 40 are disposed on the base substrate. A first transparent auxiliary electrode line 40 electrically connects two adjacent sub-electrodes 101 having a touch electrode lead 20 disposed therebetween, for example, as shown in FIG. 2b. The first transparent auxiliary electrode line 40 may form a protrusion that protrudes upwardly and away from the base substrate. The first transparent auxiliary electrode line 40 may be disposed on a touch electrode lead 20, for example, as shown in FIGS. 2b, 3b, and 4c. The first transparent auxiliary electrode line 40 may be formed of a transparent conductive material, for example, an indium tin oxide (ITO) material.

Figure 4C:
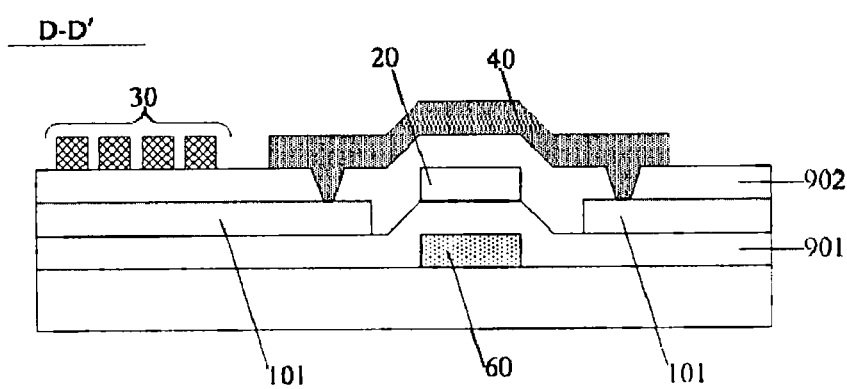
FIG. 4c shows a cross-section of FIG. 4a along the D-D' line.

The first transparent auxiliary electrode line 40 may be disposed on a side of the data line 60 opposite from the base substrate, for example, as shown in FIG. 4c. The first transparent auxiliary electrode line 40 may be positioned to cover the data line 60. Optionally, a first transparent auxiliary electrode line 40 may cover an entirety of a surface of the data line 60 facing the first transparent auxiliary electrode line 40. The first transparent auxiliary electrode line 40 may extend in a direction parallel to the extension direction of the data line 60.

In at least some embodiments, the width of the first transparent auxiliary electrode line 40 is larger than the width of the data line 60. However, the specific width of the first transparent auxiliary electrode line 40 is not particularly limited, as long as the width is larger than that of the data line 60 and is capable of shielding the second transparent electrode 30 from data line interferences.

In at least some embodiments, to further strengthen the shielding effect of the first transparent auxiliary electrode line 40, the length of the first transparent auxiliary electrode line 40 in the extension direction of the data line 60 is longer than or equal to the length of the adjacent sub-electrodes 101. In alternative embodiments of the present disclosure, the length of a first transparent auxiliary electrode line 40 may be shorter than the length of the adjacent sub-electrode 101.

When the length of the first transparent auxiliary electrode line 40 is too long, an inadvertent electrical connection could form during fabrication between the first transparent auxiliary electrode line 40 and other transparent auxiliary electrode lines located above or below the data line 60. Such an electrical connection can cause short-circuiting. Therefore, the length of the first transparent auxiliary electrode line 40 in the extension direction of the data line 60 is preferably equal to the length of the adjacent sub-electrodes 101.

In at least some embodiments, for example, as shown in FIGS. 4a and 5a, the first transparent auxiliary electrode line 40 may form a T-shape. The vertical portion of the T-shape is parallel to an extension direction of the data line 60. Each of the two ends of the horizontal portion of the T-shape is electrically connected to a sub-electrode 101. A first transparent auxiliary electrode line 40 thus configured can reduce the risk of a short-circuit, for example, during fabrication of the first transparent auxiliary electrode line 40 and the second transparent electrodes 30.

Further as shown in FIGS. 4a and 5a, the width of the vertical portion of the T-shape may be larger than a separation distance between adjacent sub-electrodes 101, and/or smaller than a separation distance between adjacent second transparent electrodes 30. This can improve the shielding effects of the first transparent auxiliary electrode line 40, increase light intensity at the periphery of a sub-pixel, and improve the quality of a display.

In an array substrate according to the present disclosure, the first transparent auxiliary electrode line 40 electrically connects adjacent sub-electrodes 101 of the first transparent electrode 10 having a touch electrode lead 20 disposed therebetween, and the width of the first transparent auxiliary electrode line 40 is larger than the width of the data line 60. The first transparent auxiliary electrode line 40 thus configured can shield the second transparent electrodes 30 (which may be pixel electrodes) not only from interference by the data line 60, but also from cross-interference between adjacent second transparent electrodes 30. Unlike existing technologies, the present disclosure makes it unnecessary to increase the width of the touch electrode lead 20, in order to shield the second transparent electrodes 30 from interferences. As a result, the array substrate of the present disclosure avoids problems that may arise from increasing the touch electrode lead width, including low light transmittance in the periphery of a sub-pixel. The first transparent auxiliary electrode line 40 of the present disclosure can extend a pixel's effective fringing field for detecting touch on a touch display device, improve light intensity at the periphery of a sub-pixel, and improve the quality of a display.

Figure 3A:
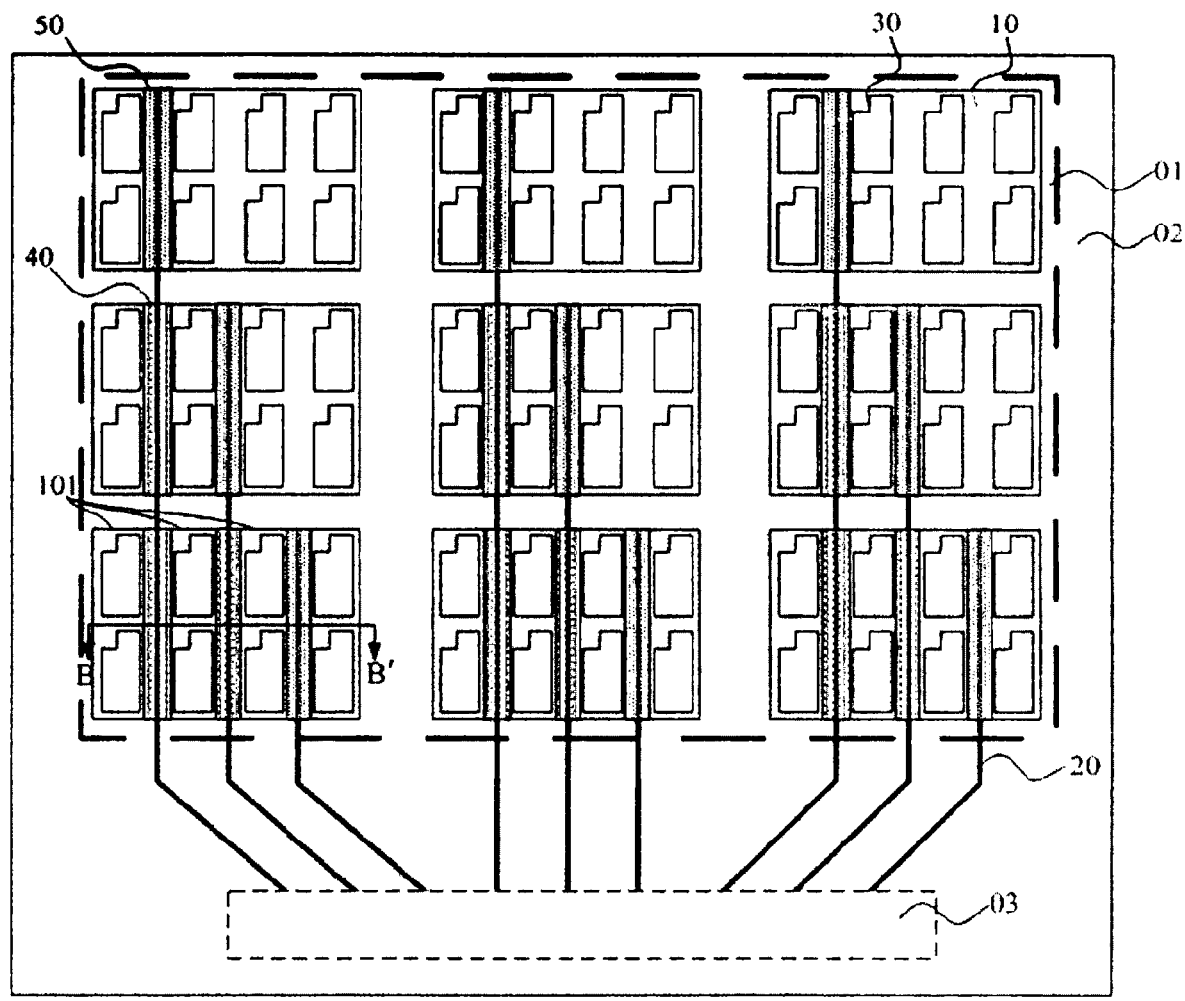
FIG. 3a shows a top view of an array substrate according to another embodiment of the present disclosure.
Figure 3B:
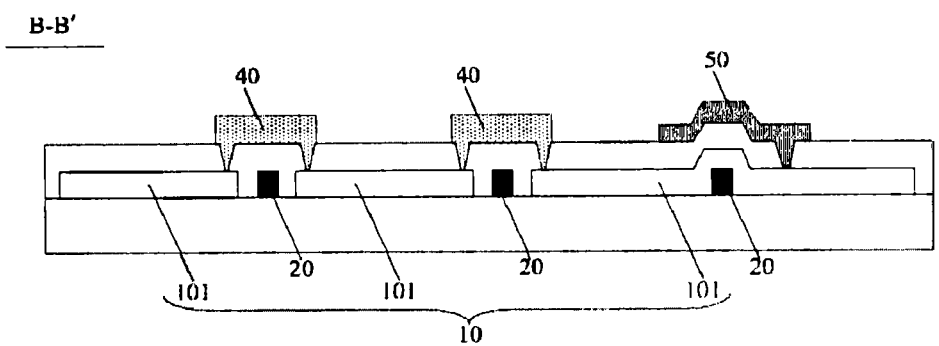
FIG. 3b shows a cross-section of FIG. 3a along the B-B' line.

As shown in FIGS. 3a and 3b, as well as in FIG. 6a, an array substrate according to the present disclosure may further comprise a plurality of second transparent auxiliary electrode lines 50. A second transparent auxiliary electrode line 50 may be disposed on the electrode stack. More particularly, at least one of the second transparent auxiliary electrode lines 50 may be disposed on a touch electrode lead 20 in contact with a first transparent electrode 10, and may be electrically connected to the first transparent electrode 10 in contact with the touch electrode lead 20.

The second transparent auxiliary electrode lines 50 may be formed in the same plane of the electrode stack as the first transparent auxiliary electrode line 40. When the first and second transparent auxiliary electrode lines 40, 50 are formed in the same plane, they can be formed in a single patterning process. The second transparent auxiliary electrode line 50 may be formed of a transparent conductive material, for example, an indium tin oxide (ITO) material. Optionally, the first and second transparent auxiliary electrode liens 40, 50 are composed of the same material.

In an array substrate according to the present disclosure, the second transparent auxiliary electrode line 50 and its configurations, particularly with respect to the touch electrode lead 20 and the sub-electrode 101, help ensure satisfactory light transmittance at the periphery of a sub-pixel, and increase light intensity at the periphery of the sub-pixel. Further, since the first and second transparent auxiliary electrode lines 40, 50 can be formed in the same patterning process, this reduces the amount of patterning necessary to form the array substrate, and therefore, the associated production costs.

Optionally, the first transparent auxiliary electrode lines 40 are insulated from the second transparent electrodes 30. Also optionally, the first transparent auxiliary electrode lines 40 are formed in the same plane as the second transparent electrodes 30. These configurations are illustrated in FIGS. 4c and 6b.

As shown in FIGS. 6a and 6b, when an array substrate includes second transparent auxiliary electrode lines 50, the first and second transparent auxiliary electrode lines 40, 50 may be formed in the same plane as the second transparent electrodes 30. This reduces the amount of patterning necessary to make the array substrate.

An array substrate according to the present disclosure can be incorporated into a touch display device. When the touch display device performs a display function, the first transparent electrodes 10 are configured to function as common electrodes. When the touch display device performs a touch sensing function, the first transparent electrodes 10 are configured to function as touch electrodes.

The second transparent electrodes 30 are configured to function as pixel electrodes. When the first transparent electrodes 10 are in the "common electrode" mode, the second transparent electrodes 30 and the first transparent electrodes 10 generate an electric field that drives the realignment of liquid crystal molecules. When the first transparent electrodes 10 are in the "touch electrode" mode, the second transparent electrodes 30 are in "inactive" and perform no functions. As a touch electrode for determining the position of a touch input on the touch display, the first transparent electrodes 10 may be configured as self-capacitive electrodes. In that case, the first transparent electrodes 10 may be configured to perform self-capacitive detection according to any manner known to a person of ordinary skill in the art.

The display region 01 of an array substrate according to the present disclosure comprises a plurality of sub-pixels. Each sub-pixel comprises a single second transparent electrode 30. Practically speaking, to enable the touch sensing functions in a touch display device, the touch display portion occupies a considerably larger surface area than the sub-pixels. Accordingly, the second transparent electrodes 30 generally have a small size, while the first transparent electrodes 10 need not be made as small as the second transparent electrodes 30. A first transparent electrode 10 may be sized to encompass a plurality of sub-pixels (for example, less than 10, more than 10, several tens of sub-pixels, and the like).

Each sub-pixel also comprises a thin film transistor 80 (TFT). Optionally, when performing a display function, the gate line 70 drives the TFT 80, and the data line 60 then transmits data signals from a drain electrode of the TFT 80 to the second transparent electrode 30.

As shown in FIG. 4a, the gate line 70 may act directly as a gate electrode for the TFT 80, and the data line 60 may act directly as a source electrode for the TFT 80. The TFT 80 may be an amorphous silicon (a-Si) TFT, a poly-silicon (p-Si) TFT, a metal oxide TFT, an organic TFT, and the like. The TFT 80 may be a "bottom gate"-type TFT or a "top gate"-type TFT. That is, there are no particular limitations on the TFT, which may be any suitable TFT known to a person of ordinary skill in the art.

Since existing technologies dispose the second transparent electrodes 30 between the base substrate and the first transparent electrodes 10 (that is, without a first transparent auxiliary electrode line 40 according to the present disclosure), passivation layers are usually omitted from between the second transparent electrodes 30 and the drain electrodes of the TFT 80, in order to reduce the amount of necessary patterning. However, in an array substrate according to the present disclosure, the absence of a passivation layer between second transparent electrodes 30 and the drain electrodes of the TFT 80 can cause unwanted electrical connections between data lines 60 and first transparent auxiliary electrode lines 40. A passivation layer is therefore necessary in an array substrate according to the present disclosure. At first glance, this passivation layer would seem to add one more patterning process to the present disclosure as compared to existing technologies. However, when the first transparent electrodes 10 are provided between the base substrate and the second transparent electrodes 30, a passivation layer is not only provided between the first transparent electrodes 10 and TFT 80, but a passivation layer is also provided between the first transparent electrodes 10 and the second transparent electrodes 30. Thus, as will be described in detail later, forming the first transparent auxiliary electrode lines 40, or even the first transparent auxiliary electrode lines 40 and the second transparent auxiliary electrode lines 50 in the same plane of the electrode stack, in fact does not increase the number of patterning processes necessary to form the array substrate.

Based on the foregoing, in an array substrate according to the present disclosure, the first transparent electrodes 10 are therefore disposed between the base substrate and the second transparent electrodes 30, for example, as shown in FIGS. 4a to 4c, as well as in FIGS. 6a and 6b.

Optionally, the touch electrode leads 20 are also disposed between the base substrate and the second transparent electrodes 30. This way, when the array substrate is performing a display function, the first transparent auxiliary electrode lines 40, being in the same plane the second transparent electrodes 30, can thus block the touch electrode leads 20 from interfering with the display.

As shown in FIGS. 4a, 5a, and 6a, the TFT 80 is disposed close to the base substrate, and the first passivation layer 901 is disposed above the TFT 80. The first transparent electrodes 10 and the touch electrode leads 20 are disposed above the first passivation layer 901. The second passivation layer 902 is disposed on a side of the first transparent electrodes 10 and the touch electrode leads 20 opposite from the first passivation layer 901. The second transparent electrodes 30 and the first transparent auxiliary electrode lines 40 are disposed above the second passivation layer 902. The first transparent auxiliary electrode lines 40 electrically connect adjacent sub-electrodes 101 of the first transparent electrodes 10 via through-holes in the second passivation layer 902.

When an array substrate includes second transparent auxiliary electrode lines 50, for example, as shown in FIGS. 6a and 6b, the second transparent auxiliary electrode lines 50 are disposed above the second passivation layer 902.

The present disclosure also provides a display panel comprising an array substrate as described above; a panel substrate facing the array substrate, the panel substrate being aligned with the array substrate; and a liquid crystal layer disposed between the array substrate and the panel substrate.

Optionally, the panel substrate may comprise a black matrix layer and a color film.

The arrangement of the color film is not particularly limited. That is, the color film may be disposed on the array substrate, instead of the panel substrate.

In a display panel according to the present disclosure, the array substrate comprises first transparent auxiliary electrode lines 40 that electrically connect adjacent sub-electrodes 101 of the first transparent electrodes 10 having a touch electrode lead 20 disposed therebetween, and the width of the first transparent auxiliary electrode lines 40 are larger than the width of the data lines 60. The first transparent auxiliary electrode lines 40 thus configured can shield the second transparent electrodes 30 (which may be a pixel electrode) not only from interference by the data lines 60, but also from mutual interference between adjacent second transparent electrodes 30. As compared to existing technologies, there is no longer a need to increase the width of the touch electrode leads 20 on the array substrate, in order to obtain similar shielding effects as described above. The array substrate of the present disclosure thus avoids problems that may arise from increasing the touch electrode lead width, including low light transmittance in the periphery of a sub-pixel. The first transparent auxiliary electrode lines 40 can extend a pixel's effective fringing field for detecting touch on a touch display device, improve light intensity at the periphery of the sub-pixel, and improve the quality of a display on the display panel.

The present disclosure also provides a display device. The display device comprises a display panel as described above; and an integrated circuit (IC) chip 03 disposed on the non-display region 02 of the array substrate, the touch electrode leads 20 on the array substrate being electrically connected to the IC chip 03, for example, as shown in FIGS. 2a and 3a.

A display device according to the present disclosure may be a liquid crystal-type device, for example, a liquid crystal display (LCD), an LCD television, a notebook computer, a digital photo frame, a tablet computer, and any other display products or components.

The present disclosure also provides a method of fabricating the array substrate, for example, as shown in FIGS. 2a and 2b, 3a and 3b, 4a, and 5a.

The method comprises forming a first electrode layer comprising a plurality of first transparent electrodes 10 and a second electrode layer comprising a plurality of second transparent electrodes 30 on a display region 01 of a base substrate. The first electrode layer and the second electrode layer are arranged in an electrode stack, and the first electrode layer and the second electrode layer are formed on different planes of the electrode stack. The method further comprises forming a plurality of data lines 60 on the electrode stack, the data lines being disposed between adjacent second transparent electrodes 30.

The method further comprises forming a plurality of touch electrode leads 20 on the electrode stack, the touch electrode leads 20 covering at least a portion of the data lines 60. The touch electrode leads 20 extend along non-overlapping extension paths in a direction parallel to the extension direction of the data lines 60 into the non-display region 02 of the base substrate. At least one touch electrode lead 20 is in contact with a first transparent electrode 10, which contact may be an electrical contact. The touch electrode lead 20 and the first transparent electrode 10 contacting the touch electrode lead 20 are disposed on different planes of the electrode stack. Each touch electrode lead 20 not in contact with a first transparent electrode 10 divides each first transparent electrode 10 positioned on the extension path of the touch electrode lead 20 into adjacent sub-electrodes 101 that are separated by a width of the extension path.

The method further comprises forming a plurality of first transparent auxiliary electrode lines 40 on a side of the data lines 60 opposite from the base substrate. Each first transparent auxiliary electrode line 40 covers an entirety of a surface of the data line 60 facing the first transparent auxiliary electrode line 40. Each first transparent auxiliary electrode line 40 electrically connects a pair of adjacent sub-electrodes 101. A width of the first transparent auxiliary electrode lines 40 is larger than a width of the data lines 60.

The present disclosure provides a method of fabricating an array substrate, which method comprises forming first transparent auxiliary electrode lines 40 that electrically connect adjacent sub-electrodes 101 having a touch electrode lead 20 disposed therebetween. Further, the width of the first transparent auxiliary electrode lines 40 is larger than the width of the data lines 60. The first transparent auxiliary electrode lines 40 thus formed can shield the second transparent electrodes 30 (which may be pixel electrodes) not only from interference by the data lines 60, but also from cross-interference between adjacent second transparent electrodes 30. The present disclosure thus removes the need to increase the width of the touch electrode leads 20 on the array substrate, in order to accomplish the above-described shielding effects. This avoids problems that may arise from increasing the touch electrode lead width, including low light transmittance in the periphery of a pixel. The first transparent auxiliary electrode lines 40 can extend a pixel's effective fringing field for detecting touch on a touch display device, improve light intensity at the periphery of the sub-pixel, and improve the quality of display on a display panel using the array substrate.

As shown in FIGS. 3a and 3b, as well as in FIG. 6a, the method of fabricating an array substrate according to the present disclosure may further comprise forming a plurality of second transparent auxiliary electrode lines 50 on the electrode stack. At least one of the second transparent auxiliary electrode lines 50 is disposed on the touch electrode lead 20 in contact with the first transparent electrode 10, and is electrically connected to that first transparent electrode 10. The second transparent auxiliary electrode lines 50 and the first transparent auxiliary electrode lines 40 are formed in the same patterning process.

In the present disclosure, the second transparent auxiliary electrode line 50 and its configurations with respect to the touch electrode lead 20 and the first transparent electrode 10 in contact with the touch electrode lead 20 help ensure satisfactory light transmittance at the periphery of a sub-pixel, and increase light intensity at the periphery of a sub-pixel. Further, since the first and second transparent auxiliary electrode lines 40, 50 can be formed in the same patterning process, this reduces the amount of patterning necessary to form the array substrate.

Optionally, as shown in FIGS. 4a and 4b, as well as in FIGS. 5a and 5b, the first transparent auxiliary electrode lines 40 are insulated from the second transparent electrodes 30. Also optionally, the first transparent auxiliary electrode lines 40 are formed in the same plane in the electrode stack as the second transparent electrodes 30, so that the first transparent auxiliary electrode lines 40 and the second transparent electrodes 30 can be formed in the same patterning process.

When an array substrate includes second transparent auxiliary electrode lines 50, for example, as shown in FIGS. 6a and 6b, the first and second transparent auxiliary electrode lines 40, 50 and the second transparent electrodes 30 are formed in the same patterning process. This reduces the number of patterning processes necessary to form the array substrate.

As shown in FIGS. 4a to 4c, the forming of the first transparent electrodes 10, the touch electrode leads 20, the second transparent electrodes 30, and the first transparent auxiliary electrode lines 40 comprises the following steps:

S10: Depositing a first passivation thin film on the base substrate having the TFT 80.

S11: In two patterning processes, forming the first transparent electrodes 10 and the touch electrode leads 20 on the base substrate having the first passivation thin film. The touch electrode leads 20 extend along non-overlapping extension paths into the non-display region 02 of the base substrate. At least one touch electrode lead 20 is in contact with a first transparent electrode 10. Each touch electrode lead 20 not in contact with a first transparent electrode 10 divides each first transparent electrode 10 positioned on the extension path of the touch electrode lead 20 into adjacent sub-electrodes 101 that are separated by a width of the extension path.

There are no particular limitations on the order in which the first transparent electrodes 10 and the touch electrode leads 20 are formed. For example, in some embodiments, the touch electrode leads 20 may be formed first on the base substrate, followed by the first transparent electrodes 10, in which case the first transparent electrode 10 in contact with a touch electrode lead 20 is disposed on the touch electrode lead 20. In other embodiments, the first transparent electrodes 10 may be formed first on the base substrate, followed by the touch electrode leads 20, in which case the first transparent electrode 10 in contact with a touch electrode lead 20 is disposed underneath the touch electrode lead 20.

S12: Depositing a second passivation thin film on the base substrate having the first transparent electrodes 10 and the touch electrode leads 20. In one patterning process, at least one pair of first through-holes is formed on a portion of the second passivation thin film facing a sub-electrode 101; at least one pair of second through-holes is formed on a portion of the second passivation thin film facing a drain electrode of the TFT 80; the second passivation thin film is formed into a second passivation layer 902; and the first passivation thin film is formed into a first passivation layer 901.

S13: Forming the second transparent electrodes 30 on the base substrate having the second passivation layer 902, and forming the first transparent auxiliary electrode lines 40 between adjacent sub-electrodes 101 having a touch electrode lead 20 disposed therebetween. A first transparent auxiliary electrode line 40 electrically connects adjacent sub-electrodes through the first through-holes. A second transparent electrode 30 electrically connects to the drain electrode of the TFT 80 through the second through-holes.

When an array substrate includes second transparent auxiliary electrode lines 50, for example, as shown in FIGS. 6a and 6b, the second transparent auxiliary electrode lines 50 are formed at the time of forming the first transparent auxiliary electrode lines 40. That is, the second transparent auxiliary electrode lines 50 are also formed in S13.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An array substrate, comprising:
  a base substrate comprising a display region and a non-display region,
  an electrode stack on the display region of the base substrate, the electrode stack comprising:
    a first electrode layer,
    a second electrode layer on a different plane of the electrode stack from the first electrode layer,
    a plurality of touch electrode leads, and
    at least one first transparent auxiliary electrode line,
  wherein:
    the first electrode layer comprises a plurality of first transparent electrodes configured to function as a common electrode and a touch electrode on a time-sharing basis, each of the first transparent electrodes comprising a plurality of sub-electrodes;
    the second electrode layer comprises a plurality of second transparent electrodes;
    at least one of the plurality of touch electrode leads is in contact with a sub-electrode;

at least one of the plurality of touch electrode leads is not in contact with a sub-electrode and is between two sub-electrodes;

the at least one first transparent auxiliary electrode line connects the two sub-electrodes having the touch electrode lead therebetween;

the first transparent auxiliary electrode line includes a first part and a second part that intersect and are electrically connected to each other, the first part connects the two sub-electrodes and extends along an arrangement direction of the two sub-electrodes, and the second part extends along an extending direction of the touch electrode lead and is located between the two sub-electrodes;

a length of the at least one first transparent auxiliary electrode line in the extension direction of the touch electrode lead is substantially equal to a length of one of the two sub-electrodes; and a width of the first transparent auxiliary electrode line is greater than a width of the touch electrode lead between the two sub-electrodes, an orthographic projection of the first transparent auxiliary electrode line on the substrate covers an orthographic projection of the touch electrode lead between the two sub-electrodes on the substrate, and the first transparent auxiliary electrode line is on a side of the touch electrode lead between the two sub-electrodes away from a data line.

2. The array substrate according to claim 1, wherein the at least one first transparent auxiliary electrode line is on a side of the touch electrode leads opposite from the base substrate.

3. The array substrate according to claim 1, further comprising at least one data line between adjacent second transparent electrodes,
wherein:
the at least one data line extends in a first extension direction;
the touch electrode leads extend in a second extension direction that is parallel to the first extension direction; and
the at least one first transparent auxiliary electrode line is on a side of the at least one data line opposite from the base substrate.

4. The array substrate according to claim 3, wherein a width of the at least one first transparent auxiliary electrode line is larger than a width of the at least one data line.

5. The array substrate according to claim 1, wherein the at least one first transparent auxiliary electrode line forms a T-shape.

6. The array substrate according to claim 1, further comprising at least one second transparent auxiliary electrode line in a same plane of the electrode stack as the at least one first transparent auxiliary electrode line,
wherein the at least one second transparent auxiliary electrode line is on the at least one touch electrode lead that is in contact with the sub-electrode.

7. The array substrate according to claim 1, wherein:
the at least one first transparent auxiliary electrode line is in a same plane of the electrode stack as the second electrode layer, and
the at least one first transparent auxiliary electrode line is insulated from the second electrode layer.

8. The array substrate according to claim 1, wherein the first electrode layer is between the second electrode layer and the base substrate.

9. The array substrate according to claim 1, further comprising a first passivation layer between the first electrode layer and the base substrate,
wherein the first electrode layer and the touch electrode lines are above the first passivation layer.

10. The array substrate according to claim 1, further comprising a second passivation layer above the first electrode layer and the touch electrode lines,
wherein:
the second passivation layer comprises at least one pair of through-holes; and
the at least one first transparent auxiliary electrode line connects the two sub-electrodes having the touch electrode lead therebetween through the at least one pair of through-holes.

11. The array substrate according to claim 1, wherein at least two touch electrode leads are in contact with respective ones of the plurality of sub-electrodes.

12. A touch display panel, comprising:
the array substrate according to claim 1,
a panel substrate facing the array substrate, the panel substrate being aligned with the array substrate; and
a liquid crystal layer between the array substrate and the panel substrate.

13. A display device, comprising:
the touch display panel according to claim 12, and
an integrated circuit chip on the non-display region of the array substrate.

14. An array substrate, comprising:
a base substrate comprising a display region and a non-display region,
an electrode stack on the display region of the base substrate, the electrode stack comprising:
a first electrode layer,
a second electrode layer on a different plane of the electrode stack from the first electrode layer,
a plurality of touch electrode leads, and
at least one first transparent auxiliary electrode line,
wherein:
the first electrode layer comprises a plurality of first transparent electrodes configured to function as a common electrode and a touch electrode on a time-sharing basis, each of the first transparent electrodes comprising a plurality of sub-electrodes;
the second electrode layer comprises a plurality of second transparent electrodes;
at least one of the plurality of touch electrode leads is in contact with a sub-electrode;
at least one of the plurality of touch electrode leads is not in contact with a sub-electrode and is between two sub-electrodes;
the at least one first transparent auxiliary electrode line connects the two sub-electrodes having the touch electrode lead therebetween;
a width of the first transparent auxiliary electrode line is greater than a width of a data line and between the two sub-electrodes, an orthographic projection of the first transparent auxiliary electrode line on the substrate covers an orthographic projection the data line on the substrate; and the first transparent auxiliary electrode line is on a side of the data line away from the substrate; and
the width of the first transparent auxiliary electrode line is greater than a width of the touch electrode lead between the two sub-electrodes, the orthographic projection of the first transparent auxiliary electrode line on the substrate covers an orthographic projection of the touch electrode lead between the two sub-electrodes on the substrate, and the first transparent auxiliary electrode line is on a side of the touch electrode lead between the two sub-electrodes away from the data line.

15. The array substrate according to claim 14, wherein the at least one first transparent auxiliary electrode line is on a side of the touch electrode leads opposite from the base substrate.

16. The array substrate according to claim 14, further comprising at least one data line between adjacent second transparent electrodes,
wherein:
the at least one data line extends in a first extension direction;
the touch electrode leads extend in a second extension direction that is parallel to the first extension direction; and
the at least one first transparent auxiliary electrode line is on a side of the at least one data line opposite from the base substrate.

17. The array substrate according to claim 14, wherein the at least one first transparent auxiliary electrode line forms a T-shape.

18. The array substrate according to claim 14, further comprising at least one second transparent auxiliary electrode line in a same plane of the electrode stack as the at least one first transparent auxiliary electrode line,
wherein the at least one second transparent auxiliary electrode line is on the at least one touch electrode lead that is in contact with the sub-electrode.

19. The array substrate according to claim 14, wherein:
the at least one first transparent auxiliary electrode line is in a same plane of the electrode stack as the second electrode layer, and
the at least one first transparent auxiliary electrode lure is insulated from the second electrode layer.

* * * * *